(12) United States Patent
Komara et al.

(10) Patent No.: US 6,463,093 B1
(45) Date of Patent: Oct. 8, 2002

(54) METHOD AND APPARATUS TO REDUCE SPURIOUS AND INTERMODULATION PRODUCTS IN WIRELESS BROADBAND MULTI-CARRIER DIGITAL TRANSCEIVER EQUIPMENT THROUGH STATIC NON-LINEARITY CORRECTION OF DIGITAL CONVERSION COMPONENTS

(75) Inventors: Michael A. Komara, Indialantic, FL (US); John R. Noll, Palm Bay, FL (US)

(73) Assignee: Airnet Communications Corporation, Melbourne, FL (US)

( * ) Notice: Subject to any disclaimer, the term of this patent is extended or adjusted under 35 U.S.C. 154(b) by 0 days.

(21) Appl. No.: 09/363,845

(22) Filed: Jul. 30, 1999

Related U.S. Application Data
(60) Provisional application No. 60/094,660, filed on Jul. 30, 1998.

(51) Int. Cl.[7] ................................................ H03M 1/10
(52) U.S. Cl. ........................ 375/220; 341/118; 341/120; 341/140
(58) Field of Search ................................ 341/118, 120, 341/126, 138, 139, 140; 375/220, 346

(56) References Cited
U.S. PATENT DOCUMENTS

| | | | |
|---|---|---|---|
| 4,903,024 A | 2/1990 | Evans et al. | 341/120 |
| 4,977,403 A | 12/1990 | Larson | 341/143 |
| 5,148,448 A | 9/1992 | Karam et al. | |
| 5,196,851 A | 3/1993 | Patel et al. | 341/140 |
| 5,396,241 A | 3/1995 | Ames et al. | 341/118 |
| 5,537,435 A | 7/1996 | Carney et al. | 375/219 |
| 5,548,286 A | 8/1996 | Craven | |
| 5,894,497 A | 4/1999 | Overton | 375/295 |
| 6,081,215 A * | 6/2000 | Kost et al. | 341/118 |
| 6,323,792 B1 * | 11/2001 | Regier | 341/118 |

OTHER PUBLICATIONS

Brannon "Overcoming Converter Nonlinearities with Dither" Analog Devices Application Note AN–410.
"Understanding the HI5721 D/A Converter Spectral Specifications" Harris Semiconductor Application Note AN9501.
Garcia, et al "Understanding Glitch in a High Speed D/A Converter" Harris Semiconductor Technical Brief TB325.1, Jan. 1995.
Garcia, et al "Measuring Spurious Free Dynamics Range in a D/A Converter," Harris Semiconductor, Copyright 1998.
Web site materials: "All–Digital Wireless Basestation," Analog Devices, Copyright 1995–1999. Souders, et al "Voltage Measurements C.5 Data Converters," National Institute of Standards and Technology, Oct. 23, 1995. Giaco "Digital to Analog Converter." Mercer et al "DACs are Optimized for Communication Transmit Path," Analog Devices, Analog Dialogue, Copyright 1995–1999.

* cited by examiner

Primary Examiner—Amanda T. Le
(74) Attorney, Agent, or Firm—Akerman Senterfitt

(57) ABSTRACT

Apparatus and method to perform the real-time correction of differential non-linearities in a broadband wireless transceiver system using a digital look-up table. Initially, the values for the digital look-up table are determined prior to full operational use of the broadband transceiver system. The one set of values represents inverse response of the transfer function of the D/A converter. The other sets of values represents the inverse response of the transfer function for each A/D converter. The inverse response values for the D/A and A/D converters are stored in a non-volatile memory. During initialization of the broadband transceiver system, the values of the inverse response of the transfer function for the D/A converter are transferred from the non-volatile memory to a high speed memory. The values of the inverse response of the transfer function for each A/D converter is also transferred to another set of high speed memory. For a transmitting signal, the signal is used as an address into the high speed memory to output a corrected value for the D/A converter. For a received signal, each output from the A/D converters is used as an address into each high speed memory. The output from each high speed memory is a corrected value for the respective A/D converter.

29 Claims, 4 Drawing Sheets

METHOD AND APPARATUS TO REDUCE SPURIOUS AND INTERMODULATION PRODUCTS IN WIRELESS BROADBAND MULTI-CARRIER DIGITAL TRANSCEIVER EQUIPMENT THROUGH STATIC NON-LINEARITY CORRECTION OF DIGITAL CONVERSION COMPONENTS

This application claims benefit of application Ser. No. 60/094,660 filed Jul. 30, 1998.

BACKGROUND OF THE INVENTION

1. Field of the Invention

This invention relates generally to multi-channel wireless communications systems. In particular, the present invention relates to a technique for reducing spurious and intermodulation products through static non-linearity correction in a wireless broadband digital multi-carrier transceiver.

2. Background of the Invention

Figure 1:
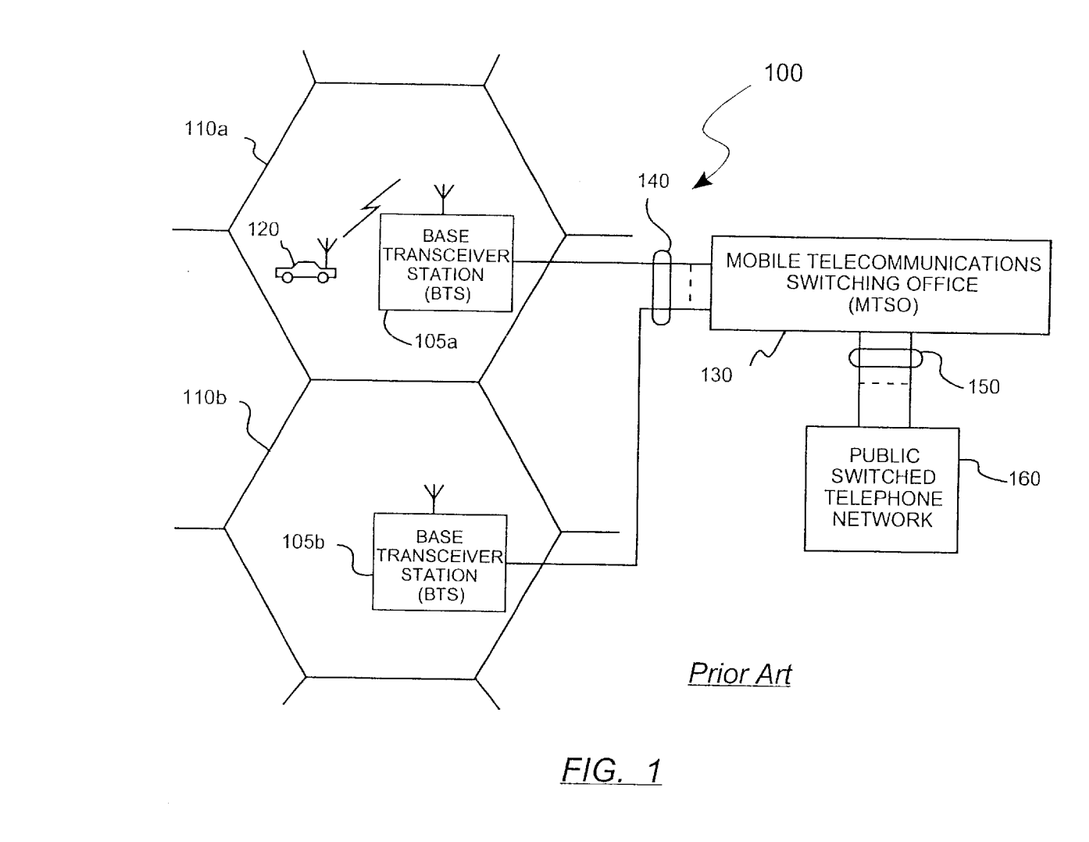
FIG. 1 is an illustration of a conventional cellular telephone system.

A conventional cellular phone system 100 is shown in FIG. 1. As illustrated in FIG. 1, the cellular phone system 100 includes a plurality of cells 110a, 110b, a mobile unit 120, a plurality of base station transceivers (BTS) 105a, 105b, communication lines 140, a mobile telecommunications switching office (MTSO) 130, an interface 150 and a switched telephone network 160.

The cellular phone system 100 has a fixed number of channel sets distributed among the BTS 105a, 105b serving a plurality of cells 110a, 110b arranged in a predetermined reusable pattern. The mobile unit 120, in a cell 110a or 110b, communicates with the BTS, 105a or 105b, respectively, via radio frequency (RF) means. The BTS 105a, 105b communicate with the MTSO 130 via communication lines 140. The MTSO 130 communicates with the switched telephone network 160 via the interface 150.

In the cellular phone system 100, the cell areas typically range from 1 to 300 square miles. The larger cells typically cover rural areas, while the smaller cells typically cover urban areas. Cell antenna sites utilizing the same channel sets are spaced by a sufficient distance to assure that co-channel interference is held to an acceptably low level.

The mobile unit 120 in a cell 110a has radiotelephone transceiver equipment which communicates with similar equipment in BTS 105a, 105b as the mobile unit 120 moves from cell to cell.

Each BTS 105a, 105b relays telephone signals between mobile units 120 and a mobile telecommunications switching office (MTSO) 130 by way of the communication lines 140.

The communication lines 140 between a cell site, 110a or 110b, and the MTSO 130, are typically T1 lines. The T1 lines carry separate voice grade circuits for each radio channel equipped at the cell site, and data circuits for switching and other control functions.

The MTSO 130 in FIG. 1 includes a switching network (not shown) for establishing call connections between the public switched telephone network 160 and mobile units 120 located in cell sites 110a, 110b and for switching call connections from one cell site to another. In addition, the MTSO 130 includes a dual access feeder (not shown) for use in switching a call connection from one cell site to another. Various handoff criteria are known in the art and utilize features such as delay ranging to indicate the distance of a mobile unit from a receiving cell site, triangulation, and received signal strength to indicate the potential desirability of a handoff. Also included in the MTSO 130 is a central processing unit (not shown) for processing data received from the cell sites and supervisory signals obtained from the switched telephone network 160 to control the operation of setting up and taking down call connections.

As the popularity of cellular systems grow, the performance of the cellular system needs to improve as more users subscribe to cellular systems. The performance of the BTS is one area of cellular systems that has been the focus of improvement.

Figure 2:
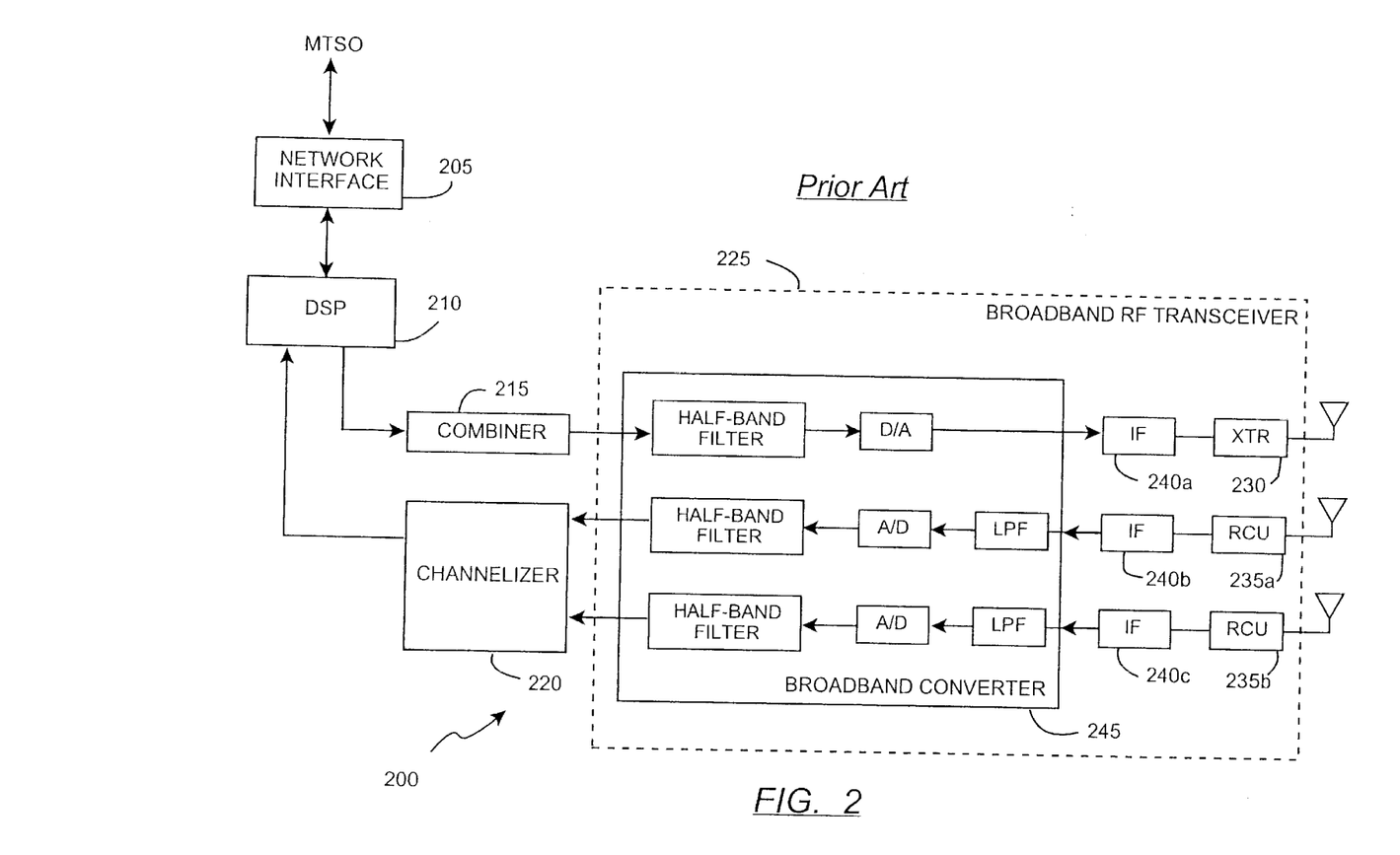
FIG. 2 is a block diagram of a modern wireless broadband digital multi-carrier transceiver system.

A block diagram of a modern wireless broadband digital multi-carrier transceiver system (BTS) 200 is illustrated in FIG. 2. The BTS 200 includes a network interface module 205, a digital signal processing (DSP) module 210, a combiner module 215, a channelizer module 220, and a broadband RF transceiver 225.

The network interface module 205 provides an interface between the BTS 200 and a MTSO. In this particular example, the network interface module 205 provides ninety-two (92). 16 kbps subrate voice channels.

The network interface module 205 is also interfaced with the DSP module 210. The DSP module 210 provides for channel coding and modulation of thirteen—(13) kbps voice channel data from the network interface module 205. The DSP module 210 multiplexes eight (8) channels into a single baseband signal for upconversion and combining with other RF carriers by the combiner module 215. The DSP module 210 also provides the equalization, demodulation and channel decoding from received channels of RF carriers that have been downconverted to a baseband signal by the channelizer module 220.

The combiner module 215 provides for receiving the baseband RF carriers from the DSP module 210. Each RF carrier is filtered and upconverted to a unique intermediate frequency (IF). All of the RF carriers in a five—(5) megaHertz (MHz) bandwidth are simultaneously combined into a single composite IF signal. This digital IF signal is then transferred to the broadband RF transceiver 225.

The channelizer module 220 provides for receiving a digital composite IF signal from the broadband RF transceiver 225. The digital composite IF signal consists of all twenty-five (25) of the 200-kiloHertz (kHz) RF carriers in a 5 MHz bandwidth. The channelizer module 220 provides for filtering and downconverting each RF carrier to a baseband signal for processing by the DSP module 210.

The broadband RF transceiver 225 provides for conversion of the digital signals for transmission to mobile users. The broadband RF transceiver 225 also provides for conversion of received analog signals to digital signals for processing by the BTS 200.

The broadband RF transceiver 225 includes an upconverter 230, two downconverters 235a, 235b, and a broadband converter 245.

Each downconverter, 235a or 235b, accepts at least a 5 MHz wide block of RF frequencies and downconverts to an IF center frequency, and then passed to the broadband converter module 245. The broadband converter module 245 digitizes the incoming analog signal and then passes the digital signal to the channelizer module 220.

The broadband converter module 245 also receives a digital broadband signal from the combiner module 215. The broadband converter module 245 converts the digital broadband signal into an analog IF signal. After filtering, the analog IF signal is upconverted to RF, and transmitted to a mobile user by the transmitter 230.

The broadband converter module 245 includes low pass analog filters 250a, 250b, a transmit digital half-band filter 255a, receive digital half-band filters 255b, 255c, a digital-to-analog converter (DAC) 260, and an analog-to-digital converter (ADC) 265a, 265b.

The low pass filters 250a, 250b provide filtering for the incoming analog signals from a mobile user.

The transmit digital half-band filter 255a provides interpolation-by-two on the transmitted digital data from the combiner module 215.

The receive digital half-band filter 225b, 255c provides for decimation-by-two and filtering of the received digitized analog signals from a mobile user.

The DAC 260 provides for a conversion of digital signals to analog signals in preparation for transmission to a mobile user.

The ADC 265a, 265b provides for a conversion of received analog signals from a mobile user into digital signals to be processed by the BTS 200.

In using a conventional digital multi-carrier BTS, the ADC and/or DAC of the BTS must operate as linearly as possible in order to avoid adjacent channels and/or harmonic distortion in the transmitted signal. However, the operational characteristics of the ADC and/or DAC may hinder in achieving the goal of linear operation.

Although designed for linear operation, the typical ADC and/or DAC are not perfectly linear. This is due to imperfect transfer functions of the converters. The imperfection may be caused by errors in resistor ladders, which are used to establish the conversion thresholds in the ADC and/or DAC.

The imperfect transfer functions of the ADC and/or DAC introduce two type of errors: integral non-linearity (INL) and differential non-linearity (DNL). INL may be defined as the worst case deviation from the straight-line approximation of a given converter's transfer function. DNL may be defined as the worst case deviation from an ideal step size between adjacent codes along the transfer curve. These two types of errors typically dominate the harmonic content of the spectrum. As the converter operates, the INL and DNL introduce spurs and intermodulation products, which restricts the spurious free dynamic range (SFDR) of the ADC and/or DAC.

SFDR is a measurable characteristic of the ADC and/or DAC that is very important in communications. SFDR is typically the usable dynamic range before spurious noise interferes or distorts the fundamental signal. In the cellular telephone environment, the bandwidth for the mobile users is typically shared. If a broadband transmitter sends spurious signals into other frequency bands used by other calls, the spurious signals can corrupt, interrupt, or obliterate the neighborhood frequency bands. Similarly, if a broadband receiver receives strong in-band interference, then spurious or intermodulation products can corrupt low-level receive signals. Thus, an ADC and/or a DAC with a wide SFDR would be preferable in order to ensure linear operation.

In addition to linear operation, it would be preferable that the ADC and/or DAC also have a high sampling rate. The high sampling rate is preferred due in large part to the Nyquist Sampling Theorem. The Nyquist Sampling Theorem requires that the sampling rate be at least twice as fast as the highest frequency component of the input signal. Violation of the Nyquist Sampling Theorem results in an effect known as aliasing where the sampled signal is not sufficiently represented and can not be restored. Typically, cellular systems operate over 5–15 MHz wide RF bands which demands a high sampling rate (e.g., 10–30 MHz) just to satisfy the minimum requirement of the Nyquist Sampling Theorem. Further, additional bandwidth surrounding the IF signal would be preferred for the purposes of analog anti-alias filtering, digital filtering, and decimation.

Thus, it would be desirable to have an ADC and/or DAC with a high SFDR and a high sampling rate. Some of today's state-of-the-art ADC and/or DAC have the high sampling rate (e.g., 50 MHz). However, these ADC and/or DAC typically have only moderate SFDR (e.g., 70 dB) that may not meet some cellular system constraints.

In order to overcome these limitations, some solutions have been suggested. Laser trimming of the resistor ladders in the ADC and/or DAC is one suggestion. By using a laser to trim the resistor ladders, the performance of the ADC and/or DAC may be improved. However, laser trimming typically yields a 6 to 12 dB improvement in SFDR at a relatively high cost.

Another solution to improving the performance characteristics of the ADCs and/or DACs is to design with a greater number of bits. By increasing the number of bits, the performance of the ADC and/or DAC may improve by approximately 6 dB per bit. However, the drawback to this solution is that the ADCs and/or DACs typically require the use of expensive hybrid technologies. Moreover, the ADCs and/or DACs draw more power for a marginal increase in performance while typically operating at slower sample rates.

Out-of-band dithering may provide another solution for improving the performance characteristics ADCs and/or DACs. Out-of-band dithering randomizes the frequencies of spurious signals and spreads the frequencies onto the noise floor; however, this also raises the noise floor and does not provide the best SFDR improvement.

There is therefore a need for methods and apparatus to reduce static non-linearity errors and increase the SFDR for a wireless broadband digital multi-carrier transceiver system.

OBJECTS OF THE INVENTION

It is an object of the present invention to provide a method and apparatus for reducing static non-linearity errors in a broadband wireless digital multi-carrier transceiver system.

It is a further object of the present invention to provide a method and apparatus for increasing the SFDR for a broadband wireless digital multi-carrier transceiver system.

SUMMARY OF THE INVENTION

In accordance with the principles of the present invention, static differential non-linearity errors of the digital to analog (D/A) converters and the analog to digital (A/D) converters in a wireless broadband transceiver system may be corrected at full operational speed via a real-time digital look-up table. Initially, the values for the digital look-up table are determined prior to full operational use of the wireless broadband transceiver system. The one set of values represents inverse response of the transfer function of the D/A converter. The other sets of values represents the inverse response of the transfer function for each A/D converter. The values for the D/A and A/D converters are stored in a non-volatile memory.

During initialization of the wireless broadband transceiver system, the values of the inverse response of the transfer function for the D/A converter are transferred from the non-volatile memory to a high-speed memory. The values of the inverse response of the transfer function for each A/D converter are also transferred to another set of high-speed memory. Thus, the high-speed memories form a digital look-up table.

For the transmission of a signal, the signal is used as an address into the high-speed memory to output a corrected value for the D/A converter. For example, a 16-bit digital path having 96 dB of SFDR resulting from digital signal processing, e.g., inverse Fast Fourier Transform (FFT), may be maintained through a lower-resolution DAC (e.g., 12 bit), because of the correction prior to the DAC.

For a received signal, each output from the lower resolution (e.g., 12-bit) ADC is used as an address into each high-speed memory. The 16-bit output from each 12-bit address of the high-speed memory is a corrected value for each respective ADC. For example, a 16-bit digital signal processing operation, e.g., an FFT, can utilize the improve SFDR which results from a 16-bit linearization following each lower-resolution ADC.

By using real time correction of non-linear errors by digital look-up table, the static differential non-linearity errors of the D/A and A/D converters, which are masked into the integrated circuits themselves, are effectively undone through the digital correction table at the converters' sampling rate. This allows for operation of broadband cellular base station transceiver equipment at a much-improved spurious free dynamic range.

BRIEF DESCRIPTION OF THE DRAWINGS

Features and advantages of the present invention will become apparent to those skilled in the art from the following description with reference to the drawings, in which.

DETAILED DESCRIPTION OF A PREFERRED EMBODIMENT

The present invention provides for improving the performance characteristics of a wireless broadband digital multi-carrier transceiver system.

In particular, the present invention provides for linearity correction tables in a wireless broadband digital multi-carrier transceiver system. The wireless broadband digital multi-carrier transceiver system includes one or more analog-to-digital converters (ADC) and a digital-to-analog converter (DAC). The linearity correction tables provide for full operational speed correction of the static differential non-linearity errors of the ADC and/or DAC. The values in the linearity correction tables are loaded into memories located in the transmit/receive path of the wireless broadband digital multi-carrier transceiver system. The memories provide a digital look-up table function.

As digital signals are received from the ADC, in the receive path, the digital signals are corrected. The received value from the ADC is used as an address value into the memory. The corrected value for the ADC is presented as output data and is then passed along to a digital half-band filter for further processing.

Signals intended for the mobile user are also corrected prior to transmission. The outgoing digital signals are used as an address into the memory to determine a pre-distorted digital value, presented as output data. This pre-distorted digital value is then passed to the DAC for conversion to analog in preparation for transmission.

Figure 3:
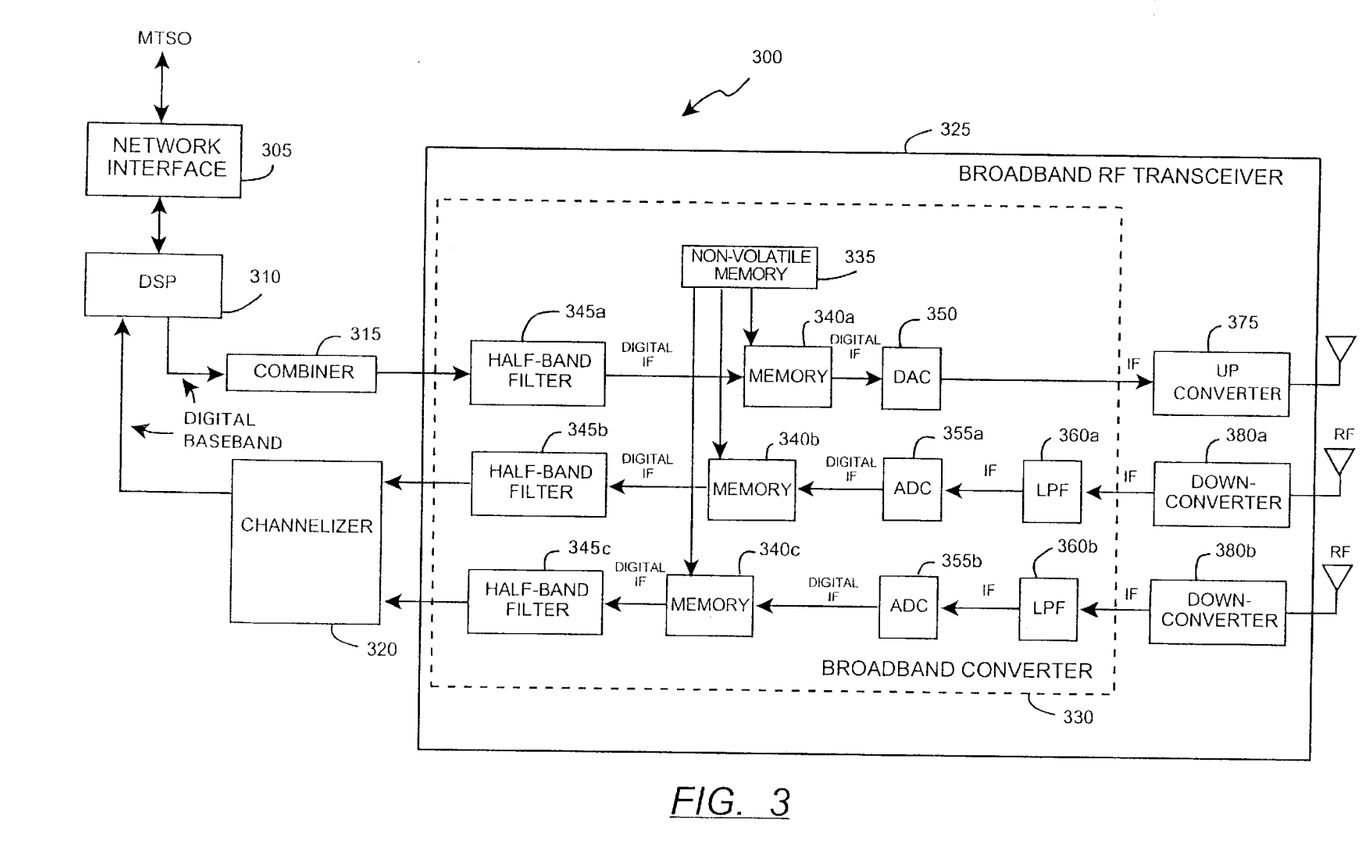
FIG. 3 is a block diagram of a wireless broadband digital multi-carrier transceiver system including static non-linearity correction memory according to the principles of the present invention.

FIG. 3 illustrates an embodiment of the present invention in a wireless broadband transceiver system (BTS) 300 including linearity correction memory 335 according to the principles of the present invention.

The BTS 300 includes a network interface module 305, digital signal processing (DSP) module 310, a combiner module 315, a channelizer module 320 and a broadband transceiver 325.

The network interface module 305 provides for an interface between the BTS 300 and a mobile telecommunications switching office (MTSO) through communication lines (not shown).

The DSP module 310 provides for channel coding and modulation of channel data from the network interface module 305. The DSP module 310 multiplexes the channel data from the network interface into individual baseband signals for upconversion. The DSP module 310 also provides the equalization, demodulation, and channel decoding from received channels of RF carriers that have been downconverted from an intermediate frequency (IF).

The combiner module 315 receives the baseband digital carriers from the DSP module 310. Each digital carrier is digitally filtered and upconverted to a unique digital IF. This composite digital IF signal is then transferred to the broadband RF transceiver 325.

The channelizer module 320 provides for receiving a digital composite IF signal from the broadband RF transceiver 325. The channelizer module 320 provides for filtering and downconverting each digitized IF carrier to a baseband signal for processing by the DSP module 310.

The broadband RF transceiver 325 includes an upconverter transmitter 375, two downconverter receivers 380a, 380b, and a broadband converter 330.

Each downconverter receiver, 380a or 380b, accepts at least a 5 MHz wide block of RF frequencies and downconverts to an IF center frequency. This IF signal is then passed to the broadband converter module 330.

The broadband converter module 330 digitizes the IF signal and then passes the digital signal to the channelizer module 320.

The broadband converter module 330 also receives a digital broadband transmit signal from the combiner module 315. The broadband converter module 330 within the broadband RF transceiver 325 converts the digital broadband signal into an analog IF signal. The IF analog signal is upconverted to RF and transmitted to a user by the transmitter 375.

The broadband converter module 330 includes, in the receive path, low pass filters 360a, 360b, ADC 355a, 355b, and half-band digital filters 345b, 345c. In the transmit path, the broadband converter module 330 includes a digital half-band filter 345a, and a DAC 350.

In the receive path, the low pass analog filters 360a, 360b provide filtering for the incoming analog signals.

The ADCs 355a, 355b are 12-bit converters, in this present embodiment that provides for a conversion of incoming analog signals from a user into digital signal for the channelizer module 320.

The half-band digital filters 345b, 345c provide for decimation-by-two and digital filtering of the A/D data in the receive path.

In the transmit path, the half-band digital filter 345a provides interpolation-by-two on the D/A data.

For the present embodiment, the DAC 350 is a 12-bit converter that provides for a conversion of incoming digital data from the combiner module 315 into analog signals for transmission to a user.

The broadband converter module 330, according to the principles of the present invention, includes a linearity correction memory 335 and memories 340a, 340b, 340c.

The linearity correction memory 335 may be a non-volatile flash random access memory (RAM). Although this embodiment discloses a flash RAM, any type of non-volatile high-speed memory may be used. Similarly, hard drives, tape or any other type of storage medium may be used.

The memories 340a, 340b, 340c may be a high-speed static RAM (SRAM). Although this embodiment discloses a high speed SRAM, any type of high-speed memory may be used.

The linearity correction memory 335 contains information which corrects the transmitted and/or receiving signal data for the differential non-linearity errors of the DAC 350 and/or ADC 355a, 355b.

The linearity correction values for the DAC 350 are initially determined during laboratory testing of the broadband converter module 325. In the present embodiment, the DAC 350 is a 12-bit converter that is stepped through all of its 4096 output levels. At each level, a high-resolution 16-bit A/D board is used to capture the precise analog voltages corresponding to each level. If the 16-bit A/D board has multiple individual A/D converters, it should be considered to split the DAC output into all A/D inputs and average the measured results to reduce the differential non-linearity in the analog measurement. A 16-bit A/D level is recorded for each of the 12-bit D/A levels. The linearity correction values are calculated for the 4096 levels, where each level has a corresponding 16-bit word. The linearity correction values are then stored in the linearity correction memory 335 as a table.

The linearity correction values for the ADC 355a, 355b are also initially determined during laboratory testing of the broadband converter module 330. A 16-bit high resolution D/A converter is used to step through the input voltage range of the broadband converter module 330 i.e. 65,536 DC levels. For each of the 65,356 levels, a 12-bit A/D level is recorded. The linearity correction values are calculated for each of the 4096 levels, where each level has a corresponding 16-bit word. The linearity correction values are then stored in the linearity correction memory 335.

During the initialization of the broadband converter module 330, the linearity correction values for the DAC 350 and ADC 355a, 355b are loaded into the high-speed memories 340a, 340b, 340c from the linearity correction memory 335. With the values transferred, the high-speed memories 340a, 340b, 340c are used as a digital look-up table. During transmission, 16-bit digital signal data from the combiner module 315 is used as an address into memory 340a. The output of the memory 340a is linearized data that is used to drive the transmitter DAC 350.

During reception, 12-bit digital signal data from the ADC 355a, 355b is used as an address into the memories 340a, 340b respectively. The 16-bit linearized data output of the memories 340b, 340c is used to drive the channelizer module 320.

The high-speed memories 340a, 340b, 340c offer a performance advantage by providing the look-up for the corrected values at the full sample rate of the ADC 355a, 355b and/or DAC 350.

Thus, the static differential non-linearities of the D/A and A/D converters, which are masked into the integrated circuits themselves at the times that the converters are manufactured, are effectively undone through the digital correction table at the converters' full sampling rate.

Figure 4:
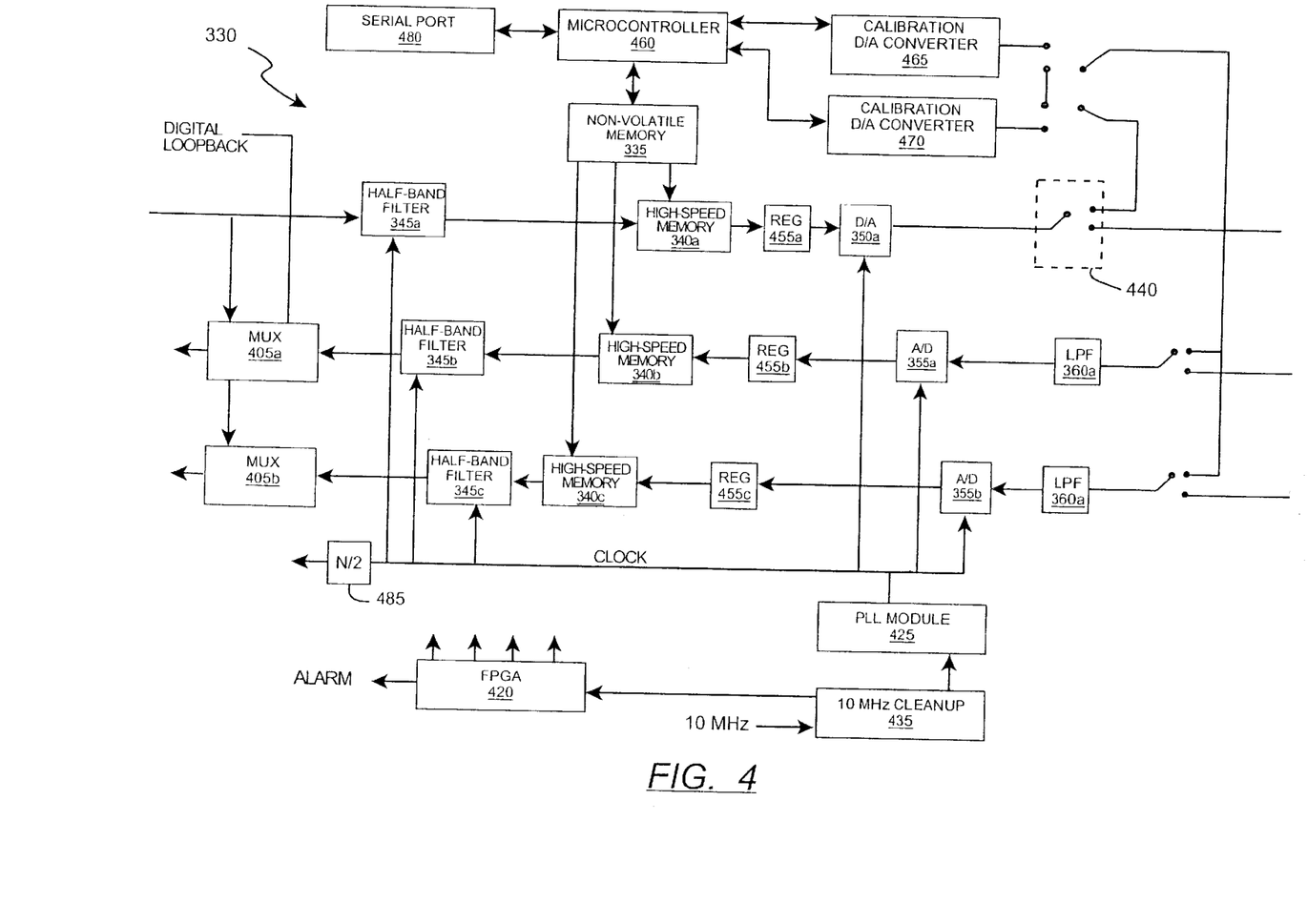
FIG. 4 is a detailed block diagram of a broadband converter module including static non-linearity correction memory according to the principles of the present invention.

FIG. 4 illustrates a more detailed block diagram of the broadband converter module 330 of FIG. 3, including the linearity correction table 335 according to the principles of the present invention.

The broadband converter module 330 includes the half-band digital filters 345a, 345b, 345c, high-speed memories 340a, 340b, 340c, DAC 350, ADC 355a, 355b, low pass analog filters 360a, 360b, and linearity correction table 335 as previously discussed. The broadband converter module 330 also includes a field programmable gate array (FPGA) module 420, phase lock loop (PLL) module 425, clean-up clock 435, multiplexers 405a, 405b, an analog loopback module 440, registers 455a, 455b, 455c, a microcontroller 460, a calibration DAC 465, a calibration ADC 470, a serial port 480, and a clock divider 485.

The clock divider module 485 provides for dividing the sample clock signal by two.

The FPGA module 420 provides for a field programmable gate array that is designed to process alarms for the broadband converter module 330 as well as programming for the PLL module 425 and general control.

The clean-up clock 435 provides a low-noise, low-jitter stable clock reference signal to the PLL module 425 derived from an external clock source.

The PLL module 425 provides a sample clock signal for the broadband converter module 330. The PLL module 425 is driven by the clean-up clock 435 in order to provide a stable clock signal for the broadband converter module 330.

The multiplexers 405a, 405b and analog loopback module 440 provide for placing the broadband converter module 330 in a loopback configuration. While in the loopback configuration, the broadband converter module 330 may perform operations to test for optimal performance.

The registers 455a, 455b, 455c provide for a temporary storage of signals between the DAC 350 and ADC 355a, 355b and the memories 340a, 340b, 340c. The registers 455a 455b, 455c are clocked by the PLL module 425.

The microcontroller 460 provides for an on-board controller to control the linearization calibration process.

The calibration DAC 465 provides for a higher resolution DAC that is slower than either ADC 355a or 355b. In the present embodiment, the calibration DAC 465 has a resolution of at least 16 bits.

The calibration ADC 470 provides for a higher resolution ADC that is slower but more precise than the DAC 350. In the present embodiment, the calibration ADC 470 has a resolution of at least 16 bits.

The serial port 480 provides for access to the microcontroller 460.

The microcontroller 460 provides for a linearization calibration. In this process, the microcontroller 460 interfaces with the calibration DAC 465 and the calibration DAC 470. The microcontroller 460 determines the static inverse response of the DAC 350 and ADC 335a, 355b using the calibration ADC 470 and the calibration DAC 465, respectively. A set of linear correction values is calculated for the DAC 350 and each ADC, 355a or 355. The sets of linear correction values are then stored in non-volatile memory 355.

During the linearization calibration process, the microcontroller 460 initiates software which places the broadband converter module 330 into an analog loopback mode through the analog loopback module 440.

In the present embodiment, the DAC 350 is a 12-bit converter that is stepped through all of its 4096 output levels. At each level, a high-resolution calibration ADC, in the present embodiment having 16 bits, is used to capture the precise analog voltages corresponding to each level. A 16-bit A/D level is recorded for each of the 12-bit D/A levels. The linearity correction values are calculated for the 4096 levels, where each level has a corresponding 16-bit word. The linearity correction values are then stored in the non-volatile memory 335 as a table.

The linearity correction values for the ADC 355a, 355b may also be determined using the linearization calibration process. The high resolution, 16 bits in the present embodiment, DAC is used to step through the input voltage range of the broadband converter module 330 i.e. 65,536 DC levels. For each of the 65,536 levels, a 12-bit A/D level is recorded. The linearity correction values are calculated for each of the 4096 levels, where each level has a corresponding 16-bit word. The linearity correction values are then stored in the non-volatile memory 335.

During the initialization of the broadband converter module 330, the linearity correction values for the DAC 350 and ADC 355a, 355b are loaded into the high-speed memories 340a, 340b, 340c from the non-volatile memory 335. With the values transferred, the high-speed memories 340a, 340b, 340c are used as a digital look-up table. During transmission, 16-bit digital signal data from the combiner module 315 is used as an address into memory 340a. The output of the memory 340a is linearized data that is used to drive the transmitter DAC 350.

During reception, 12-bit digital signal data from the ADC 355a, 355b is used as an address into the memories 340b, 340b respectively. The 16-bit linearized data output of the memories 340b, 340c is used to drive the channelizer module 320.

While the invention has been described with reference to the exemplary embodiments thereof, those skilled in the art will be able to make various modifications to the described embodiments of the invention without departing from the true spirit and scope of the invention.

What is claimed is:

1. An apparatus for correcting differential non-linearity errors in a wireless broadband digital multi-carrier transceiver system, said apparatus comprises:
   at least one digital-to-analog converter;
   at least one analog-to-digital converters;
   at least one memory having stored therein a set of linear correction values representing inverse responses of a plurality of transfer functions for at least one of said at least one digital-to-analog converter and said at least one analog-to-digital converter.

2. The apparatus for correcting differential non-linearity errors in a wireless broadband digital multi-carrier transceiver system of claim 1, wherein:
   a digital output of said at least one memory drives said at least one digital-to-analog converter.

3. The apparatus for correcting differential non-linearity errors in a wireless broadband digital multi-carrier transceiver system of claim 1, wherein:
   a digital output of said at least one analog-to-digital converter provides one or more addresses of said at least one memory.

4. The apparatus for correcting differential non-linearity errors in a wireless broadband digital multi-carrier transceiver system of claim 1, wherein:
   said set of linear correction values are determined by inputting each output level of said at least one digital-to-analog converter to a higher resolution analog-to-digital converter to determine a corresponding correction value.

5. The apparatus for correcting differential non-linearity errors in a wireless broadband digital multi-carrier transceiver system of claim 4, wherein:
   said higher-resolution analog-to-digital converter has resolution between 16 and 18 bits inclusive.

6. The apparatus for correcting differential non-linearity errors in a wireless broadband digital multi-carrier transceiver system of claim 1, wherein:
   said set of linear correction values are determined by inputting each output level of a higher resolution digital-to-analog converter to said at least one analog-to-digital converter to determine a corresponded correction value.

7. The apparatus for correcting differential non-linearity errors in a wireless broadband digital multi-carrier transceiver system of claim 6, wherein:
   said higher-resolution digital-to-analog converter has resolution between 16–18 bits inclusive.

8. The apparatus for correcting differential non-linearity errors in a wireless broadband digital multi-carrier transceiver system of claim 1, wherein:
   said at least one digital-to-analog converter and said at least one analog-to-digital converter are lower-resolution converters of resolution between 12 and 14 bits inclusive.

9. The apparatus for correcting differential non-linearity errors in a wireless broadband digital multi-carrier transceiver system of claim 1, further comprising:
   a non-volatile memory.

10. The apparatus for correcting differential non-linearity errors in a wireless broadband digital multi-carrier transceiver system of claim 9, wherein:
    said non-volatile memory stores said set of linear correction values.

11. The apparatus for correcting differential non-linearity errors in a wireless broadband digital multi-carrier transceiver system of claim 9, wherein:
    said non-volatile memory includes a hard drive.

12. The apparatus for correcting differential non-linearity errors in a wireless broadband digital multi-carrier transceiver system of claim 9, wherein:
    said non-volatile memory includes a tape drive.

13. The apparatus for correcting differential non-linearity errors in a wireless broadband digital multi-carrier transceiver system of claim 9, wherein:
    said set of linearity correction values is initially stored in said non-volatile memory and transferred into said at least one memory at the time of initialization of said wireless broadband digital multi-carrier transceiver system.

14. The apparatus for correcting differential non-linearity errors in a wireless broadband digital multi-carrier transceiver system of claim 1, wherein:
    said at least one memory is a high-speed random access memory.

15. The apparatus for correcting differential non-linearity errors in a wireless broadband digital multi-carrier transceiver system of claim 1, wherein:

said at least one memory is a high-speed flash random access memory.

16. The apparatus for correcting differential non-linearity errors in a wireless broadband digital multi-carrier transceiver system of claim 1, further comprising:

a calibration analog-to-digital converter;

a calibration digital-to-analog converter;

a microcontroller to interface with said calibration analog-to-digital converter and said calibration digital-to-analog converter, wherein said microcontroller determines sets of linearity correction values for said at least one digital-to-analog converter and said at least one analog-to-digital converter at power-up.

17. The apparatus for correcting differential non-linearity errors in a wireless broadband digital multi-carrier transceiver system of claim 1, wherein:

said microcontroller stores said sets of linearity correction values in a non-volatile memory.

18. A method for correcting differential non-linearity errors in a digital multi-carrier wireless broadband transceiver system, said method comprising:

initializing a memory to store therein a look-up table having a plurality of sets of linearity correction values representing inverse responses of a plurality of transfer functions for one of at least one digital-to-analog converter and at least one analog-to-digital converter; and correcting a digital signal using said linearity correction values obtained from said look-up table corresponding to said digital signal;

wherein said digital signal is an input signal to said at least one digital-to-analog converter if said digital signal is to be transmitted by said system or an output signal of said at least one analog-to-digital converter if said digital signal is a signal received by said system.

19. The method for correcting differential non-linearity errors in a wireless broadband digital multi-carrier transceiver system of claim 18, said method further comprising:

outputting said corrected digital signal from said memory to said at least one digital-to-analog converter.

20. The method for correcting differential non-linearity errors in a wireless broadband digital multi-carrier transceiver system of claim 18, said method further comprising:

outputting said corrected digital signal from said memory at an address location driven by a digital receive output of said at least one analog-to-digital converter.

21. The method for correcting differential non-linearity errors in a wireless broadband digital multi-carrier transceiver system of claim 18, wherein:

said memory is a high speed static random access memory.

22. The method for correcting differential non-linearity errors in a wireless broadband digital multi-carrier transceiver system of claim 18, wherein:

said at least one digital-to-analog converter has a resolution between 12 and 14 bits inclusive.

23. The method for correcting differential non-linearity errors in a wireless broadband digital multi-carrier transceiver system of claim 18, wherein:

said at least one analog-to-digital converters has resolution between 12 and 14 bits inclusive.

24. The method for correcting differential non-linearity errors in a wireless broadband digital multi-carrier transceiver system of claim 18, wherein:

storing initially said plurality of sets of linearity correction values in a non-volatile memory.

25. The method for correcting differential non-linearity errors in a wireless broadband digital multi-carrier transceiver system of claim 18, wherein:

said step of initializing said memory comprises:

downloading said plurality of sets of linearity correction values form said non-volatile memory to said memory.

26. The method for correcting differential non-linearity errors in a wireless broadband digital multi-carrier transceiver system of claim 18, wherein:

one of said plurality of sets of linear correction values is determined by comparing each output level of one of said at least one digital-to-analog converter and said at least one of analog-to-digital converter with an output level of a higher resolution analog-to-digital converter and a higher resolution digital-to-analog converter, respectively, and corresponding corrected value.

27. The method for correcting differential non-linearity errors in a wireless broadband digital multi-carrier transceiver system of claim 26, wherein:

said higher resolution analog-to-digital converter and said higher resolution digital-to-analog converter have a resolution between 16 and 18 bits inclusive.

28. The method for correcting differential non-linearity errors in a wireless broadband digital multi-carrier transceiver system of claim 18, wherein:

said initializing of memory comprises:

deriving one of said plurality of sets of linear correction values by comparing each output level of one of said at least one digital-to-analog converter and said at least one of analog-to-digital converter with an output level of a calibration analog-to-digital converter and a calibration digital-to-analog converter, respectively, and corresponding corrected value at power-up.

29. The method for correcting differential non-linearity errors in a wireless broadband digital multi-carrier transceiver system of claim 28, wherein:

said calibration analog-to-digital converter and said calibration digital-to-analog converter have resolution between 16 and 18 bits inclusive.

* * * * *